(12) United States Patent
Kothekar et al.

(10) Patent No.: US 10,180,447 B2
(45) Date of Patent: Jan. 15, 2019

(54) ELECTRIC FUSE CURRENT SENSING SYSTEMS AND MONITORING METHODS

(71) Applicant: EATON INTELLIGENT POWER LIMITED, Dublin OT (IE)

(72) Inventors: Milind Suresh Kothekar, Maharashtra (IN); Santosh Kumar Sharma, Maharashtra (IN); Robert Stephen Douglass, Wildwood, MO (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 60 days.

(21) Appl. No.: 14/931,046

(22) Filed: Nov. 3, 2015

(65) Prior Publication Data

US 2017/0122988 A1   May 4, 2017

(51) Int. Cl.
| | |
|---|---|
| *G01R 19/32* | (2006.01) |
| *G01R 15/14* | (2006.01) |
| *G01R 19/00* | (2006.01) |
| *G01R 1/04* | (2006.01) |
| *G01R 27/16* | (2006.01) |
| *G11C 29/02* | (2006.01) |
| *G11C 29/50* | (2006.01) |
| *G11C 17/16* | (2006.01) |

(Continued)

(52) U.S. Cl.
CPC ............... *G01R 19/32* (2013.01); *G01R 1/04* (2013.01); *G01R 15/146* (2013.01); *G01R 19/0092* (2013.01); *G01R 27/16* (2013.01); *G01R 31/07* (2013.01); *G01R 31/08* (2013.01); *G06K 7/10366* (2013.01); *G06K 7/1413* (2013.01); *G11C 17/16* (2013.01); *G11C 17/18* (2013.01); *G11C 29/027* (2013.01); *G11C 29/50008* (2013.01); *H01H 85/048* (2013.01); *H01H 85/165* (2013.01); *H02H 3/046* (2013.01); *H02H 3/085* (2013.01); *G11C 2029/0409* (2013.01); *H02H 1/0007* (2013.01); *H02H 1/0038* (2013.01)

(58) Field of Classification Search
CPC ..... G01R 31/2827; G01R 31/013; H02H 3/20
USPC ........................................ 324/500, 537, 549
See application file for complete search history.

(56) References Cited

U.S. PATENT DOCUMENTS

| | | |
|---|---|---|
| 3,684,923 A | 8/1972 | Keeler |
| 3,958,206 A | 5/1976 | Klint |

(Continued)

FOREIGN PATENT DOCUMENTS

| | | |
|---|---|---|
| CN | 101789578 B | 7/2012 |
| DE | 102004002360 A1 | 8/2005 |

(Continued)

OTHER PUBLICATIONS

International Search Report and Written Opinion of International Application No. PCT/US2016/055708, dated Jan. 19, 2017, 16 pages.

(Continued)

*Primary Examiner* — Giovanni Astacio-Oquendo
(74) *Attorney, Agent, or Firm* — Armstrong Teasdale LLP

(57) ABSTRACT

Electrical current sensing and monitoring methods include connecting sensing a voltage across a conductor having a non-linear resistance such as a fuse element. The current flowing in the conductor is calculated based on at least a first detected state of the sensed voltage and a thermal equilibrium characterization of the conductor.

20 Claims, 9 Drawing Sheets

(51) Int. Cl.
*G11C 17/18* (2006.01)
*G06K 7/10* (2006.01)
*G06K 7/14* (2006.01)
*H01H 85/048* (2006.01)
*H01H 85/165* (2006.01)
*G01R 31/07* (2006.01)
*G01R 31/08* (2006.01)
*H02H 3/08* (2006.01)
*H02H 3/04* (2006.01)
*G11C 29/04* (2006.01)
*H02H 1/00* (2006.01)

(56) References Cited

U.S. PATENT DOCUMENTS

| | | | |
|---|---|---|---|
| 4,284,126 A * | 8/1981 | Dawson | G05D 23/1917 |
| | | | 165/11.1 |
| 4,413,221 A * | 11/1983 | Benjamin | G01R 31/3631 |
| | | | 320/129 |
| 4,661,807 A | 4/1987 | Panaro | |
| 5,134,253 A * | 7/1992 | Doubrava | G06F 3/046 |
| | | | 178/18.07 |
| 5,153,802 A | 10/1992 | Mertz et al. | |
| 5,418,487 A | 5/1995 | Armstrong, II | |
| 5,453,696 A | 9/1995 | Becker et al. | |
| 5,519,561 A | 5/1996 | Mrenna et al. | |
| 5,541,516 A * | 7/1996 | Rider | G01V 3/08 |
| | | | 324/326 |
| 5,635,841 A * | 6/1997 | Taylor | F02P 17/00 |
| | | | 324/380 |
| 5,731,733 A | 3/1998 | Denham | |
| 5,831,507 A | 11/1998 | Kasamatsu et al. | |
| 5,831,509 A | 11/1998 | Elms et al. | |
| 5,896,059 A | 4/1999 | Durham et al. | |
| 6,054,330 A | 4/2000 | Phipps et al. | |
| 6,114,856 A * | 9/2000 | Bitts | G01R 31/2829 |
| | | | 324/512 |
| 6,225,809 B1 * | 5/2001 | Watano | G01N 27/60 |
| | | | 324/464 |
| 6,346,845 B1 | 2/2002 | Choi | |
| 6,424,035 B1 | 7/2002 | Sapp et al. | |
| 6,492,747 B1 | 12/2002 | Hoffmann | |
| 6,498,526 B2 | 12/2002 | Lim et al. | |
| 6,541,983 B2 | 4/2003 | Khoury | |
| 6,583,977 B1 | 6/2003 | Oglesbee | |
| 6,670,843 B1 | 12/2003 | Moench et al. | |
| 6,686,744 B1 | 2/2004 | Tinsley | |
| 6,987,396 B2 * | 1/2006 | Yang | G01N 17/02 |
| | | | 324/700 |
| 7,098,721 B2 | 8/2006 | Ouellette et al. | |
| 7,109,877 B2 | 9/2006 | Cuk | |
| 7,119,603 B2 | 10/2006 | Newman | |
| 7,153,712 B1 | 12/2006 | Sidhu et al. | |
| 7,170,299 B1 | 1/2007 | Anand et al. | |
| 7,190,629 B2 | 3/2007 | Pan et al. | |
| 7,205,746 B2 * | 4/2007 | Batson | H02J 7/0047 |
| | | | 320/107 |
| 7,215,175 B1 | 5/2007 | Mandal et al. | |
| 7,295,057 B2 | 11/2007 | Bhushan et al. | |
| 7,376,036 B2 | 5/2008 | Ueda | |
| 7,400,482 B2 | 7/2008 | Parker | |
| 7,518,899 B2 | 4/2009 | Perry et al. | |
| 7,573,273 B2 | 8/2009 | Yanagida | |
| 7,576,635 B2 | 8/2009 | Bender et al. | |
| 7,609,577 B2 | 10/2009 | Anand et al. | |
| 7,733,096 B2 | 6/2010 | Lin et al. | |
| 7,791,972 B2 | 9/2010 | Ouelette et al. | |
| 7,969,275 B2 | 6/2011 | Hartzog | |
| 7,978,493 B1 | 7/2011 | Tan et al. | |
| 8,030,181 B2 | 10/2011 | Chung et al. | |
| 8,031,453 B2 | 10/2011 | Nelson et al. | |
| 8,032,045 B2 | 10/2011 | Chae et al. | |
| 8,035,943 B2 | 10/2011 | Turpin et al. | |
| 8,036,005 B2 | 10/2011 | Gebert | |
| 8,140,278 B2 | 3/2012 | Rodseth et al. | |
| 8,189,362 B2 | 5/2012 | Tan et al. | |
| 8,207,783 B2 | 6/2012 | Liao et al. | |
| 8,208,336 B2 | 6/2012 | Do | |
| 8,213,256 B2 | 7/2012 | Kim et al. | |
| 8,265,506 B2 | 9/2012 | Young-Min et al. | |
| 8,349,665 B2 | 1/2013 | Kim | |
| 8,351,291 B2 | 1/2013 | Lee et al. | |
| 8,400,745 B1 | 3/2013 | Zansky et al. | |
| 8,427,857 B2 | 4/2013 | Chen et al. | |
| 8,587,912 B2 | 11/2013 | Jezierski et al. | |
| 8,686,596 B2 | 4/2014 | Huss et al. | |
| 8,724,280 B2 | 5/2014 | Andersson et al. | |
| 8,762,083 B2 | 6/2014 | Rodseth et al. | |
| 8,804,448 B2 | 8/2014 | Park et al. | |
| 8,929,046 B2 | 1/2015 | Cyuzawa et al. | |
| 8,953,294 B2 | 2/2015 | Graf et al. | |
| 8,964,444 B2 | 2/2015 | Hall et al. | |
| 2009/0224323 A1 | 9/2009 | Im et al. | |
| 2010/0023286 A1 | 1/2010 | Rodseth et al. | |
| 2011/0026177 A1 | 2/2011 | Atluri et al. | |
| 2012/0127621 A1 | 5/2012 | Knapp, Jr. et al. | |
| 2013/0211751 A1 | 8/2013 | Park et al. | |
| 2014/0012520 A1 | 1/2014 | Zhao et al. | |
| 2014/0062492 A1 | 3/2014 | Boxshall et al. | |
| 2014/0247057 A1 | 9/2014 | Rodseth et al. | |
| 2014/0369105 A1 | 12/2014 | Lin et al. | |
| 2017/0060150 A1 * | 3/2017 | Stefanski | G05D 23/27 |
| 2018/0036740 A1 * | 2/2018 | Nelson | B02C 19/18 |
| 2018/0059176 A1 * | 3/2018 | Ding | G01R 1/0433 |

FOREIGN PATENT DOCUMENTS

| | | |
|---|---|---|
| DE | 202009002852 U1 | 7/2009 |
| EP | 342101 A1 | 11/1989 |
| EP | 1536537 B1 | 1/2012 |
| FR | 2689677 A1 | 10/1993 |
| GB | 2280960 A | 2/1995 |
| JP | 2000295777 A | 10/2000 |
| JP | 2005197104 A | 7/2005 |
| JP | 4272044 B2 | 6/2009 |
| JP | 4772833 B2 | 9/2011 |
| KR | 20080015215 A | 2/2008 |
| KR | 2008046510 A | 5/2008 |
| WO | 2006002446 A1 | 1/2006 |
| WO | 2010055430 A2 | 5/2010 |
| WO | 2010061047 A1 | 6/2010 |
| WO | 2011102777 A1 | 8/2011 |
| WO | 2013167127 A1 | 11/2013 |
| WO | 102012014969 A1 | 1/2014 |
| WO | 2015057504 A1 | 4/2015 |

OTHER PUBLICATIONS

International Preliminary Report on Patentability for International Application PCT/US2016/055708, dated May 17, 2018, 13 pages.

* cited by examiner

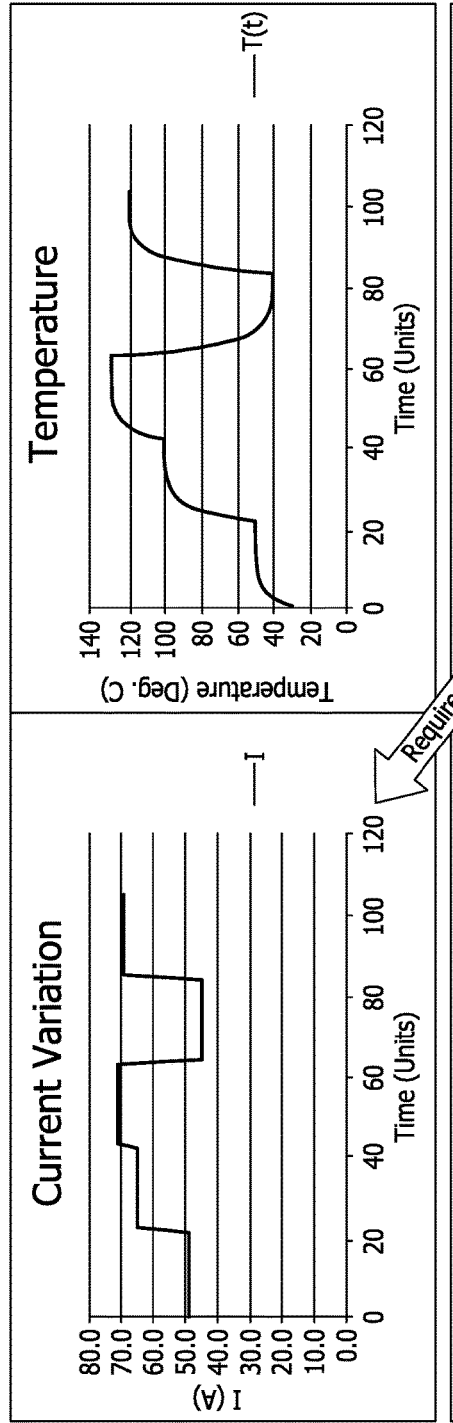
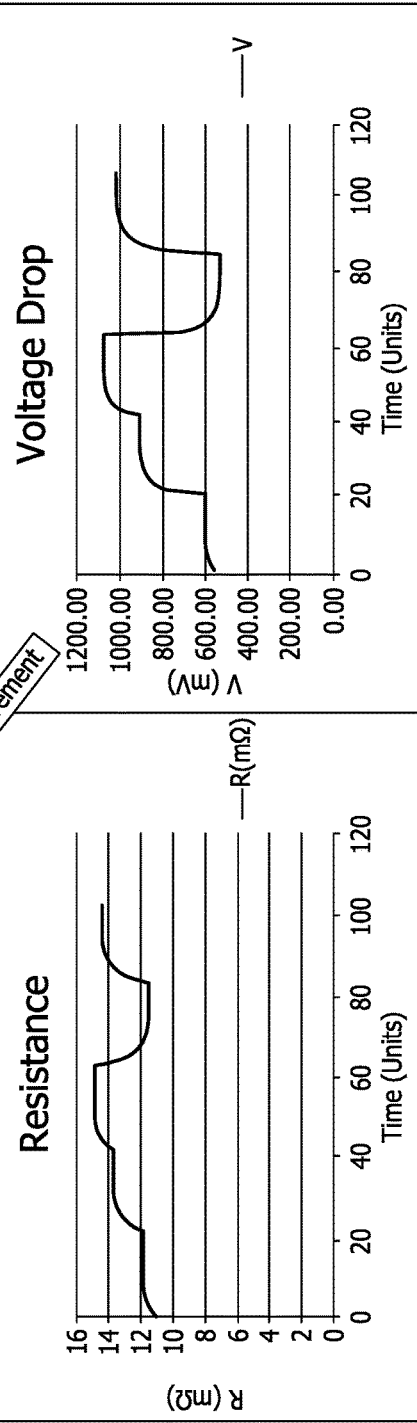
FIG. 6A  FIG. 6B  FIG. 6C  FIG. 6D

ELECTRIC FUSE CURRENT SENSING SYSTEMS AND MONITORING METHODS

CROSS REFERENCE TO RELATED APPLICATIONS

This application relates in subject matter to U.S. patent application Ser. No. 14/803,315 filed Jul. 20, 2015 and incorporated by reference herein.

BACKGROUND OF THE INVENTION

The field of the invention relates generally to electrical power distribution systems, and more specifically to systems and methods of sensing and monitoring electrical current flow through a conductor having a non-linear resistance in an electrical circuit.

In electrical products and systems of various types, current sensing is performed for a variety of reasons. Current sensing and monitoring facilitates oversight and control of equipment and processes in various aspects, as well as facilitates circuit protection functionality. Various different types of contact and non-contact current sensors are presently used today, including but not necessarily limited to resistance shunts, current transformers (CTs), hall-effect sensors and fiber-optic current sensors (FOCS) that use the magneto-optic effect (Faraday effect).

In many residential-type electrical power systems where current sensing is required, the relative cost of conventional current sensors is high and as such the use of current sensors has been limited for residential applications. For electrical products including current sensing capability, the cost of the current sensor components can account for as much as 50% of the total product cost. For industrial and commercial-type products requiring current sensing, the sensing components can account for as much as 20% of the total system cost. The relatively high cost of presently utilized current sensor technology is an impediment to otherwise beneficial adoption of current sensing on a broader scale in the electrical industry. Lower cost and/or simpler current sensing solutions are accordingly desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

FIGS. 5A, 5B and 5C illustrate exemplary thermal equilibrium characteristics of the exemplary fuse relating to FIGS. 3 and 4 and utilized algorithmically by the current sensing technique shown in FIG. 2, wherein FIG. 5A is a plot of temperature equilibrium voltage versus temperature equilibrium current, wherein FIG. 5B is a plot of temperature equilibrium resistance versus temperature equilibrium voltage, and wherein FIG. 5C is a plot of temperature equilibrium change in temperature versus voltage.

FIGS. 6A, 6B. 6C and 6D illustrate sensed parameters of the electrical fuse in use utilizing the techniques shown in FIG. 2 and the characteristics shown in FIGS. 5A, 5B and 5C, wherein FIG. 6A is a plot of calculated current versus time experienced by the electrical fuse, wherein FIG. 6B is a plot of calculated temperature versus time experienced by the electrical fuse, wherein FIG. 6C is a plot of calculated resistance versus time experience by the electrical fuse, and wherein FIG. 6D is a plot of sensed voltage versus time utilizing the technique shown in FIG. 2.

FIGS. 7A and 7B represent an exemplary performance of the technique illustrated in FIG. 2, wherein FIG. 7A illustrates a plot of calculated resistance of the fuse element versus actual resistance of the fuse element in use, and wherein FIG. 7B illustrates a plot of algorithmic error in calculating the resistance.

FIGS. 8A and 8B represent an exemplary performance of the technique illustrated in FIG. 2, wherein FIG. 8A illustrates a first exemplary comparison plot of calculated current versus actual current experienced by the electrical fuse, and wherein FIG. 8B illustrates a second exemplary comparison plot of calculated current versus actual current experienced by the electrical fuse.

DETAILED DESCRIPTION OF THE INVENTION

Figure 1:
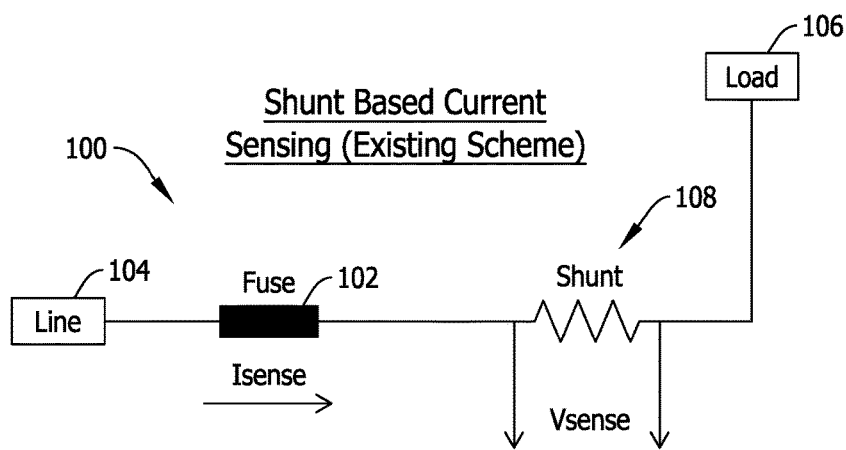
FIG. 1 is a partial circuit schematic of a portion of an electrical power system illustrating a conventional current sensing technique.

FIG. 1 is a partial circuit schematic of a portion of an electrical power system 100 illustrating a conventional current sensing technique sometimes referred to as shunt based current sensing.

As shown in FIG. 1, the power system 100 includes an electrical fuse 102 connected between line side circuitry 104 and load side circuitry 106. The fuse 102 includes a housing and a conductive fuse element that is structurally configured to melt, disintegrate, vaporize or otherwise structurally fail in response to a predetermined overcurrent condition and effectively create an open circuit between the line side circuitry 104 and the load side circuitry 106. When the predetermined overcurrent condition occurs in the line side circuitry 104, the load side circuitry 106 is therefore protected by the fuse 102 and its fuse element that electrically isolates the load side circuitry 106 when the fuse element is exposed to the overcurrent conditions as electrical current can no longer flow through the fuse 102, thereby preventing otherwise damaging current from flowing to the load side circuitry 106. The opening of the fuse element in response to the overcurrent condition is permanent and the fuse 102 must be replaced with another fuse 102 to restore the electrical connection between the line side circuitry 104 and the load side circuitry 106.

As also shown in FIG. 1, a resistive shunt 108 is connected in series with the fuse 102 in the electrical power system 100. By monitoring or sensing a voltage $V_{sense}$ across the shunt 108, the current $I_{sense}$ flowing though the fuse 102 can be easily determined from Ohm's law (I=$V_{sense}$/$R_{shunt}$). Ideally, the resistive shunt 108 has a broad linear resistance band allowing for direct conversion of the voltage $V_{sense}$ to the current $I_{sense}$. The broad linear resistance band in the resistive shunt 108, which is typically not available in other components in the electrical system, is highly desired and accordingly the resistive shunt 108 is rated for full current and is manufactured with high precision. The resistive shunt 108 is therefore a relatively expensive, although effective current sensing solution. In an electrical power system 100 including many electrical fuses 102, the costs of providing resistive shunts are multiplied and can be substantial.

Other current sensors are known that may be utilized in lieu of the resistive shunt 108 described, including those mentioned above, but they tend be bulkier and/or more expensive than the resistive shunt 108 and therefore have not completely met the need for compact and lower cost solutions.

Exemplary embodiments of systems and methods are described herein below that facilitate a compact, reliable and cost effective current sensing, monitoring and control functions and advanced capabilities in electrical power systems. This is achieved, as explained in detail below, by connecting a compensation circuit across a conductor having a non-linear resistance such as a fuse element. The current flowing in the conductor having non-linear resistance can be calculated based on a sensed voltage across the conductor once the resistance of the conductor is determined using unique relationships based on fuse characteristics described below. Method aspects will be in part apparent and in part explicitly discussed in the following description.

Figure 2:
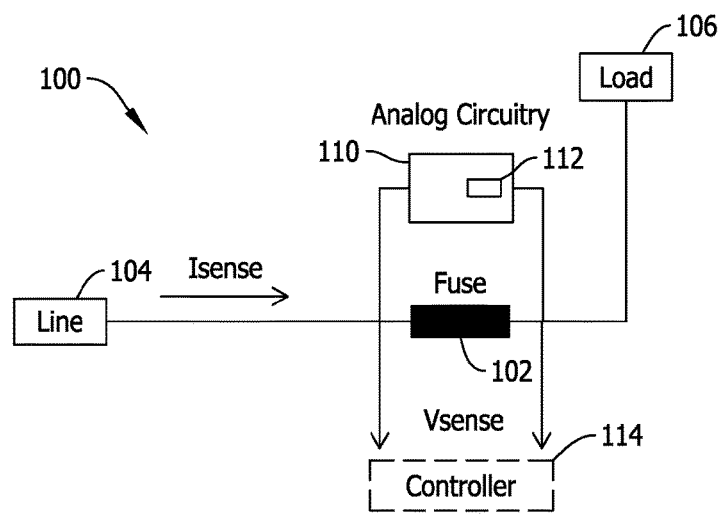
FIG. 2 is a partial circuit schematic of a portion of an electrical power system illustrating a first exemplary current sensing technique according to an embodiment of the present invention.

FIG. 2 illustrates a first exemplary current sensing technique according to an embodiment of the present invention. Comparing FIGS. 1 and 2, it is seen that the resistive shunt 108 is eliminated and the voltage $V_{sense}$ is derived directly across the fuse 102. As described below, the current $I_{sense}$ may be determined indirectly from the voltage Vsense without involving a relatively expensive series-connected shunt 108 as shown in FIG. 1. The elimination of the resistive shunt 108, as afforded by the present invention, is advantageous beyond cost reduction. Elimination of the resistive shunt also saves physical space, and in applications where many fuses are utilized in a common location, the size of the location needed to accommodate the fuses can be reduced. For example, when many fuses are located in a combiner box, an electrical panel, or a fuse block, the physical size of the combiner box, electrical panelboard or fuse block can be reduced while still providing current sensing capability and advanced fuse status features, abnormal fuse detection and alarms, etc. For power systems including large numbers of fuses, the cost reduction and space savings can be significant by eliminating separately provided current sensors while still providing advanced monitoring and oversight of the electrical power system, as well as the performance of the fuse.

The technique shown in FIG. 2 recognizes that the fuse 102, as are all electrical fuses, is essentially a calibrated resistor. Because a resistor drops a voltage during operation, knowing the voltage $V_{sense}$, the current $I_{sense}$ can be calculated using Ohms Law if fuse resistance $R_{fuse}$ is known. Unlike the shunt based current sensing shown in FIG. 1, the voltage $V_{sense}$ across the fuse 102 does not allow a simple and direct determination of the current $I_{sense}$ using Ohm's law. This is because the fuse element in the fuse 102 exhibits a non-linear resistance. That is, the resistance of the fuse element $R_{fuse}$ is subject to change in different operating conditions and as the resistance changes the detected voltage $V_{sense}$ will vary in a manner that does not always correlate with a change in current. Consequently, the challenge to implement the current sensing with the fuse 102 instead of a shunt is to determine the fuse resistance $R_{fuse}$ at any given point in time.

Compensation circuitry 110 is therefore provided to, among other things, iteratively detect at successive time periods the voltage $V_{sense}$, determine the resistance $R_{fuse}$ at each particular point in time, and calculate the current $I_{sense}$ using Ohm's law and/or predetermined relationships between voltage and resistance, temperature and current for the fuse element under certain operating conditions. Over time, changes in the fuse current $I_{sense}$ can be reliably determined from the detected fuse voltage $V_{sense}$ only, and effective current sensing may be realized without conventional current sensors such as those described above.

The compensation circuitry 110 may accordingly include a controller 112 that measures the fuse element voltage $V_{sense}$ at periodic intervals to account for variations in fuse resistance $R_{fuse}$, determines the fuse resistance $R_{fuse}$ at each periodic interval, and computes the current $I_{sense}$ based on the monitored voltage $V_{sense}$ and the determined resistance $R_{fuse}$. While the controller 112 is illustrated as part of the compensation circuitry 110, the controller may alternatively be provided elsewhere, including but not limited to in a sub-metering module (SMM) in, for example a combiner box including the fuse 102. That is, the controller 112 need not be a part of the compensation circuitry 110 itself in all embodiments, but instead may be separately provided.

The detected voltage $V_{sense}$ in some embodiments may optionally be input to another optional controller 114 at a local or remote location relative to the fuse 102 that calculates the current $I_{sense}$ in the manner described below. The controller 114 may be provided in addition to or in lieu of the controller 112. It is understood, however, that the functionality of the controllers 112, 114 shown may be combined into a single controller if desired. Regardless, one or both of the controllers 112, 114 may advantageously determine the resistance $R_{fuse}$ at any given point in time as explained below, and based on the determination of the resistance $R_{fuse}$ the current $I_{sense}$ can be computed using Ohm's law (i.e., $I_{sense}$=$V_{sense}$/$R_{fuse}$) while achieving a relatively smaller and more cost effective current sensing system than that shown in FIG. 1.

The controllers 112 and/or 114 may each be processor-based control devices. As used herein, the term "processor-based" shall refer not only to controller devices including a processor or microprocessor, but also to other equivalent elements such as microcomputers, programmable logic controllers, reduced instruction set (RISC) circuits, application specific integrated circuits and other programmable circuits, logic circuits, equivalents thereof, and any other circuit or processor capable of executing the functions described below. The processor-based devices listed above are exemplary only, and are thus not intended to limit in any way the definition and/or meaning of the term "processor-based".

In lieu of or in addition to the controller 112, the compensation circuitry 110 may include a differential amplifier providing a direct or indirect voltage input to a processor-based device, or another voltage sensor or voltage sensor circuitry known in the art may be applied in the compensation circuitry 110 to detect the voltage $V_{sense}$ for purposes of calculating the current $I_{sense}$. The current calculation may be made in whole or in part within the circuitry 110 or the circuitry 110 may supply a voltage signal to another device to make the computation or complete the current computation.

In contemplated embodiments, algorithms are utilized by one or both of the controller devices 112 or 114 to translate the non-linear response of the fuse element into calculated current readings. The calculated current readings are based upon an idealized performance of the fuse element at a steady state temperature equilibrium as explained further below. Such idealized performance can be mathematically modeled using known relationships and/or experimentally established and verified for particular types and configurations of electrical fuses and fuse elements. The modeled performance can be expressed in graphical plots and/or mathematical relationships that can be utilized to calculate electrical current flowing through the fuse as changes in the voltage $V_{sense}$ are detected.

Specifically, a resistance of the fuse ($R_{fuse}$) may be determined based upon the voltage $V_{sense}$ using predetermined algorithms, models, and relationships of fuse characteristics such as those described below. Unique identifiers or codes for such models and relationships can then be coded onto or into the individual fuse 102 with, for example, an RFID tag or bar code label. As also described below, a fuse reader may alternatively be integrated into a housing of a fuse holder or a housing of a disconnect switch, sometimes referred to as a base. Via such a reader element and unique identifiers for the relationships needed to calculate the current, intelligence is provided for the same reader element to monitor voltage drops across different types of fuses and still accurately calculate current flowing current in the fuse.

While the concepts described are illustrated in the context of the fuse 102 being utilized to sense current, the concepts illustrated in FIG. 2 could alternatively be applied to other conductive elements besides a fuse. The use of circuit elements like fuses, circuit breaker contacts, electrical connections and all other components that introduce series resistance into the circuit can be effectively applied with an accompanying compensation circuit operating. Since each circuit element used for current sensing can have its own unique and individual variables and properties, a scheme for coding these unique variables and properties with the circuit element is required for proper and accurate translation of the resistor voltage to a calculated current. A coding scheme may include, as mentioned above, RFID tagging and or bar code labeling.

Those in the art will appreciate that the electronic circuitry proposed requires an appropriate isolation scheme to isolate the system voltage of the electrical power system 100 from the electronics. Once determined, current data can be transmitted to a remote location, via, for example, optical or wireless communication systems, although other types of communication are possible if desired. Prognostic and/or diagnostic capability is provided that enhances oversight, monitoring and control of an electrical power distribution system, using a comparatively low cost and simple architecture of the current sensing system.

As described in detail below, contemplated embodiments simply and directly measure the voltage drop $V_{sense}$ across the fuse 102 at a predetermined frequency such as 20 Hz and, based on the measured voltage drop and prior characterization of the fuse via applied relationships of the fuse under idealized conditions, compute the current that causes the measured voltage drop. Advantageously, the current sensing architecture can be achieved at relatively low cost while providing sufficient accuracy for certain applications where only telemetry accuracy is required instead of high precision.

The current sensing techniques described herein are premised on an idealized assumption that, while a fuse element typically exhibits a non-linear resistance when connected to energized electrical circuitry, a resistance of the fuse element is linearly dependent on temperature in certain operating conditions. With a focus toward these operating conditions, such linear dependence on temperature provides a basis to easily determine a resistance of the fuse element at those conditions, and in turn, calculate the current $I_{sense}$ at any desired point in time. In actuality, the idealized assumption behind the determination of fuse resistance and calculated current may or may not be realized, but nonetheless current can still be computed accurately in many instances as demonstrated further below.

Considering a well-known type of fuse element such as a conductive strip of metal (e.g., a copper strip) having one or more weak spots or areas of reduced cross sectional area, the idealized assumption of linear resistance and temperature at first glance may appear to be inappropriate. Copper has a temperature co-efficient of 0.0038 and applying this coefficient one may expect a resistance of the fuse element to change by about 23% across a 60° C. temperature differential assuming that resistance actually does change linearly with temperature. However, in reality this assumption may amount to around 0.38% error per ° C. in conditions wherein the fuse element simply does not follow the assumed behavior.

Figure 3:
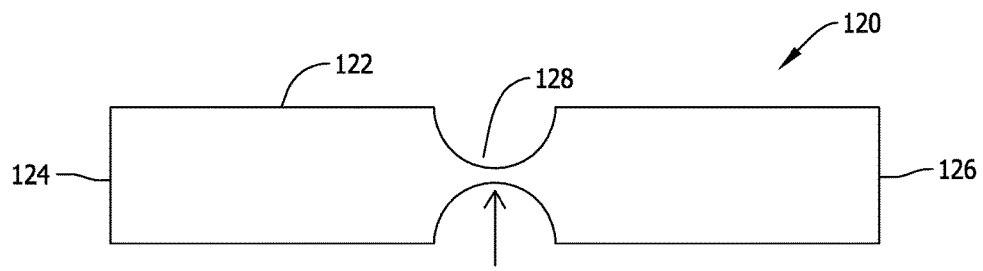
FIG. 3 illustrates an exemplary temperature distribution of an exemplary fuse element in use.

FIG. 3 shows an exemplary fuse element 120 fabricated as an elongated metal strip 122 having a first end 124, a second end 126 and a weak spot 128 having a reduced cross sectional area. When conducting current from the end 124 to the end 126 the temperature of the fuse element 120 is not uniform. As the cross sectional area is reduced approaching the weak spot 128 the temperature is warmer than in areas having a larger cross sectional area at the ends 124, 126. This non-uniform temperature effect relates to the electrical resistance of the weak spot 128 being different, by design, from the electrical resistance at the ends 124, 128. The non-uniform temperature effect explains in part why in at least some operating conditions there is an error between the idealized assumption that fuse resistance is linear with temperature and actual fuse performance that shows the resistance to be nonlinear. Nonetheless, the current sensing technique described herein assumes an idealized average uniform temperature across the fuse element during the operation of fuse, yet still allows a reliable and accurate current computation in many instances.

Applying the idealized assumption, when current passes through the fuse element 120 power is dissipated in the fuse element 120 in the form of heat such that an increase in temperature (i.e., a heating) of the fuse element 120 occurs over time. At the same time, however, the fuse element 120 is cooled by its surrounding environment. When first subjected to a current, or to a change in current from an initial level to an increased level, the temperature of the fuse element 120 will increase until a point that the heating and cooling counteract one another and the average temperature of the fuse element 120 reaches a constant value, referred to herein as a temperature equilibrium point. That is, the temperature equilibrium point is reached when heat generated by the joule heating of the fuse element 120 and heat dissipated to the ambient environment per unit time are exactly the same. This temperature equilibrium point corresponds to what is sometimes referred to as a thermal equilibrium condition.

Figure 4:
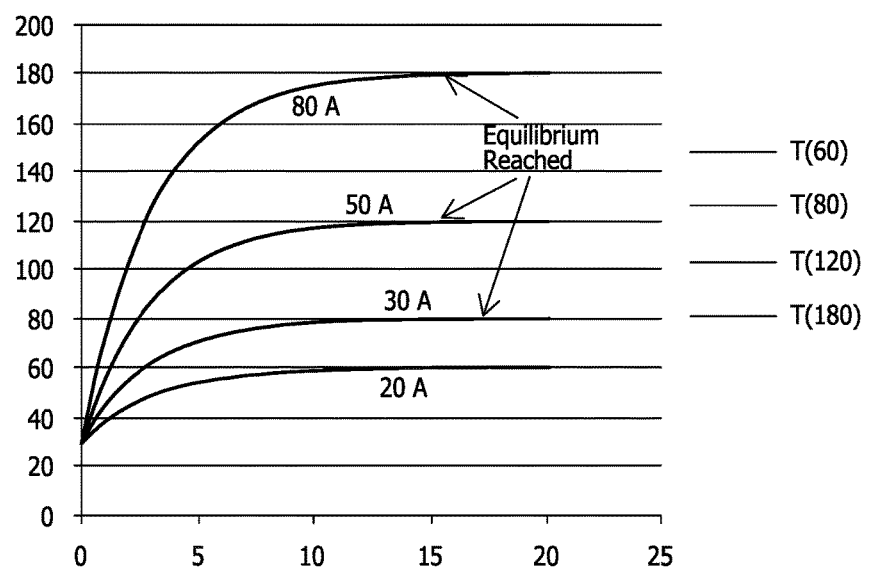
FIG. 4 is an exemplary temperature versus time graph of an exemplary fuse including the exemplary fuse element shown in FIG. 3.

FIG. 4 illustrates various temperature equilibrium points or thermal equilibrium conditions for exemplary fuses and currents. In the examples shown in FIG. 4, fuse temperature rises from an initial value at time 0 to a substantially constant value, referred to herein as an equilibrium current value, at a subsequent point in time. In the examples shown, a first equilibrium temperature is reached at about 60° C. for a first equilibrium current value of about 20A, a second equilibrium temperature is reached at about 80° C. for a second equilibrium current value of about 30A, a third equilibrium temperature is reached at about 120° C. for a third equilibrium current value of about 50A, and a fourth equilibrium temperature is reached at about 180° C. for a fourth equilibrium current value of about 80A.

As also seen in FIG. 4, thermal equilibrium conditions are obtained at each of the 20A, 30A, 50A and 80A equilibrium currents at respectively different times. The thermal equilibrium conditions for the lower equilibrium currents are realized before the thermal equilibrium conditions for the higher equilibrium currents. While a number of examples of equilibrium currents and equilibrium temperatures are shown in FIG. 4, others values for both temperature and current are possible, and the equilibrium temperatures will vary depending on the structural configuration of the fuse element(s) utilized in the fuse and for different fuses having different fuse elements. In general, however, the concepts described herein are applicable to any structure and configuration of a fuse element.

For a constant ambient temperature of a fuse in operation, thermal equilibrium conditions and corresponding thermal equilibrium temperatures are reached for every current level and temperature uniquely. As may be appreciated from the plots of FIG. 4, equilibrium temperature is a function of current. No two systems can have the same fuse equilibrium temperature but different equilibrium current levels. Further, in a thermal equilibrium condition, resistance of the fuse ($R_{fuse}$) is a linear function of temperature. Consequently, an equilibrium resistance of the fuse element is also a function of current once the thermal equilibrium is reached.

The product of an equilibrium current and equilibrium resistance in the thermal equilibrium condition provides the equilibrium voltage of the fuse. This is important to the current sensing of the present invention since the voltage is the only easily measurable parameter ($V_{sense}$ in FIG. 2) in the complete set of Voltage, Current, Temperature and Resistance that the fuse may exhibit any given point in time. Assuming that the voltage sensed $V_{sense}$ is the equilibrium voltage, the current of interest $I_{sense}$ matches the equilibrium current that can be calculated readily as long as the characteristics of the fuse in the thermal equilibrium condition are carefully assessed and known in advance. This is referred herein to thermal equilibrium characterization of the fuse and is explained next.

Figures 5A, 5B, 5C:
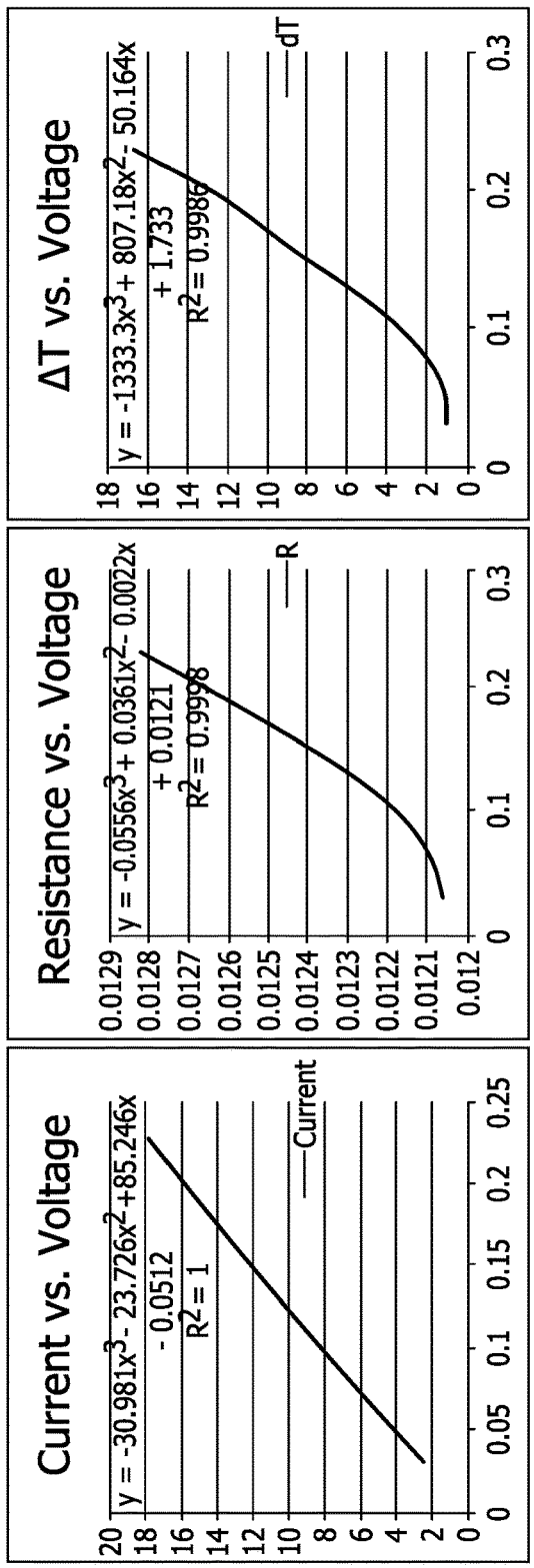

In the thermal equilibrium condition, current, temperature and resistance of the fuse element can all be modelled as functions of voltage as shown in FIGS. 5A, 5B and 5C that represent an exemplary thermal equilibrium characterization of an exemplary fuse. Based on thermal equilibrium characterization plots such as these, the current ($I_{sense}$ in FIG. 2) can be back-calculated as a function of voltage at all times. As seen in FIG. 5A, the equilibrium voltage and current are linear, while in FIGS. 5B and 5C the resistance and change in temperature are not linear functions of voltage. The thermal equilibrium characterization functions can be mathematically modeled and experimentally verified, or may be empirically established in different embodiments for each specific type of structural configuration of a fuse element and/or fuse. It is recognized that different structural configurations of fuses and fuse elements may result in unique current, temperature and resistance functions of voltage that may vary considerably from the exemplary functions shown.

As current changes from one value to another, the voltage instantaneously changes with current as seen in FIG. 5A according to Ohm's law that is a linear mathematical function. In the thermal equilibrium characterization contemplated, FIG. 5A represents an equilibrium voltage to equilibrium current relationship. Once the equilibrium resistance is determined, the equilibrium current can easily be calculated or determined from this plot.

As seen in the thermal equilibrium characterization plot of FIG. 5B, the resistance change is not immediate or instantaneously changed like the current does as voltage changes from an initial value to a final value. As shown at the bottom left of the plot, the resistance change is initially a slow and gradual one as the voltage is changed, and as a result, the resistance change initially follows or lags the voltage change for a bit as it takes some time for the fuse element to physically react to the change in voltage. The resistance accordingly fails to change at all for a brief time period even though the voltage has changed, the resistance changes slowly in a second time period following the first, and the resistance eventually rises more rapidly thereafter as voltage continues to rise. As a result, multiple and distinct resistance responses to voltage changes are seen in FIG. 5B before and after the fuse element has fully and physically reacted to the change in voltage from the initial value. In the thermal equilibrium characterization contemplated, FIG. 5B represents an equilibrium voltage to equilibrium resistance relationship. Once the equilibrium voltage is determined, assumed to be $V_{sense}$ in the embodiments contemplated, the equilibrium resistance can determined from this plot. Once the equilibrium resistance is determined, it may be used to calculate the current using Ohm's law apart from the plot shown in FIG. 5A, or alternatively may be derived directly from the plot of FIG. 5A.

As seen in FIG. 5C, the temperature change initially also follows or lags the voltage change as again it takes some time for the fuse element to physically react to the change in voltage as shown at the bottom left of the plot. The change in temperature changes slowly at first even though the voltage has changed, and eventually rises more rapidly, but not quite evenly in the exemplary plot, as voltage continues to rise. The change in temperature corresponds to increased power dissipation as the current increases from the initial value. In the thermal equilibrium characterization contemplated, FIG. 5C represents an equilibrium voltage to equilibrium temperature relationship.

FIGS. 6A, 6B. 6C and 6D illustrate as example of computed parameters of the electrical fuse in use utilizing the technique shown in FIG. 2 and the thermal equilibrium characterization relationships shown in FIGS. 5A, 5B and 5C.

The voltage drop ($V_{sense}$) is monitored by the circuit 110 or controller 114 and is shown to vary as shown in FIG. 6D over a certain period of time. The sensed or monitored voltage drop $V_{sense}$ is assumed to represent an equilibrium voltage and the various voltage levels detected can be determined to correspond to the current variation shown in FIG. 6A using the thermal equilibrium characterization of the fuse as follows.

Once the assumed equilibrium voltage is known via sensing the voltage $V_{sense}$ across the fuse at a time $t_0$, the equilibrium resistance $R_{fuse}$ at time $t_0$ can be determined or back-calculated from the thermal equilibrium characterization relationship plotted in FIG. 5B. The current $I_{sense}$ at time $t_0$ can then be computed via Ohm's law and corresponds to $V_{sense}/R_{fuse}$. Alternatively, once the equilibrium voltage is known via sensing the voltage $V_{sense}$ across the fuse at time $t_0$, the equilibrium resistance $R_{fuse}$ at time $t_0$ can be back-calculated or otherwise determined from the relationship plotted in FIG. 5A. Because the voltage $V_{sense}$ is sampled at a predetermined frequency, changes in voltages are detected and corresponding changes in current are repeatedly calculated over time via subsequent determinations at times $t_1$, $t_2$, $t_3 \ldots t_n$ as shown in the plot of FIGS. 6D and 6A, respectively such that real-time current changes and data are made available for assessing an operation of the electrical power system.

Likewise, the temperature plot seen in FIG. 6B can be derived in real time from the sensed equilibrium voltage $V_{sense}$ of FIG. 6D at times $t_1$, $t_2$, $t_3 \ldots t_n$ and the temperature relationship may plotted as shown in FIG. 5C. The resistance plot seen in FIG. 6C can be also iteratively derived and determined in real time from the sensed equilibrium voltage of FIG. 6D and the relationship plotted in FIG. 5B.

Since equilibrium voltage is assumed to correspond to $V_{sense}$ at all times in the contemplated examples, then during transient conditions from one detected voltage level to another (corresponding to changes in current) wherein the thermal equilibrium condition has yet to occur, the equilibrium resistance presumed does not actually match the resistance of the fuse element at each affected point in time. Such transient conditions lead to erroneous calculation of current $I_{sense}$ since actual fuse resistance will vary slowly over time temperature while current changes abruptly as discussed above. That is, at least in some instances the equilibrium resistance calculation that is based on an assumed steady state will result in the resistance being determined at a thermal equilibrium temperature which hasn't actually been reached yet and as such the calculated current and the actual current will not correspond. As the steady state equilibrium temperature is approached, though, the calculated current $I_{sense}$ becomes more and more accurate.

Figure 7B:
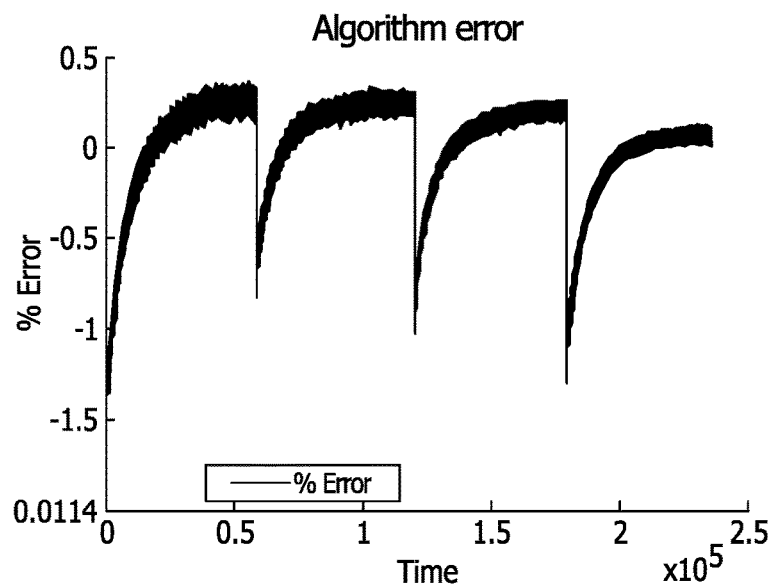
Figure 7A:
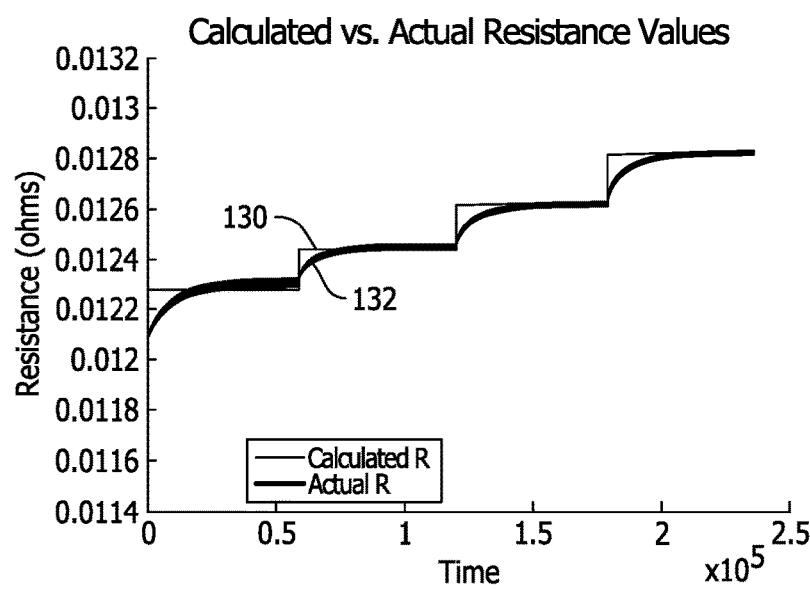

The performance of the algorithm described above that assumes equilibrium voltage and resistance is shown in FIGS. 7A and 7B. FIG. 7A shows the calculated resistance 130 rising in a number of sharp steps whereas the actual resistance 132 is rising more gradually, but the calculated resistance 130 and the actual resistance 132 eventually converge to substantially the same values in large part. FIG. 7B shows the algorithm error (i.e., the error between the calculated resistance 130 and the actual resistance 132 in FIG. 7A) and shows the error rate to be quite small.

The accuracy of the current sensing method using such an algorithm primarily depends on the accuracy of the equilibrium characterization of the fuse as explained above in relation to FIGS. 5A, 5B and 5C.

The algorithmic method to sense voltage and compute the current according to thermal equilibrium characterizations as described thus far will work best in circumstances where the current being calculated does not change that often and/or when the current does not need to be calculated that often. In such circumstances, the algorithmic current sensing method described advantageously turns a simple passive device (i.e., the electrical fuse) into an intelligent prognostic and diagnostic tool for monitoring, overseeing and troubleshooting an electrical power system. The algorithmic current sensing method described involves a simple architecture that only requires the measurement of voltage across the fuse element, which can be done using a simple, low cost differential amplifier. The algorithmic current sensing method described is rather cost-effective due to simplicity of architecture required, and the size of the hardware needed can be small enough to fit inside a fuse holder, a fuse block, a disconnect device or even the fuse itself as further described below.

In electrical power systems where the current does change randomly and needs to calculated more often, a more sophisticated approach is advisable than described so far. Hence, a more sophisticated approach is described below that contemplates that any given voltage change $V_{sense}$ detected can be attributed to one of the following three states or scenarios. Utilizing the exemplary parameters discussed below, current can be calculated using a different approach and criteria in each state.

First, a detected voltage change can be attributed to an actual change in current. In this scenario, the change in current causes a sudden spike in detected voltage as discussed above in relation to Figure 5A. The voltage change is practically instantaneous and can also be detected instantaneously. During this change the fuse resistance remains momentarily the same since the maximum change in resistance possible within a small amount of time, (e.g., 0.1 s) is very low (e.g., less than 0.01%). This effect can be seen in the plot of FIG. 5B at the bottom left.

This first state can be reliably detected by sensing a ramp rate (i.e., a rate of change) of the detected voltage and comparing it to a predetermined threshold value. If the ramp rate is greater than the predetermined threshold, the detected voltage change may be assumed to be attributable to an actual change in current. A constant fuse resistance may further be assumed when this state is detected, and the current may be computed based on the instantaneous voltage divided by the equilibrium resistance value determined just prior to the voltage spoke.

Second, a detected voltage change can be attributed to a change in resistance of the fuse while the current remains constant or unchanged. This second scenario or state, unlike the first state or scenario described above, contemplates a non-thermal equilibrium condition wherein fuse resistance is variable. This state typically occurs right after the first state where current has already changed and the detected voltage spikes as described above in relation to the first scenario. In this second state, the detected voltage changes slowly with a maximum ramp rate dependent on a predetermined fuse time constant $\tau$ that relates to a time during which the temperature increases with time according to an inverse exponential relationship. The resistance of the fuse element exhibits a similar change according to an inverse exponential relationship and the same time constant. Thus, in this state wherein current is constant, the detected voltage increases as an inverse exponential (a hypothesis proved by laboratory testing). The resistance change as a function of voltage may be modeled based on experimentation and the time constant $\tau$ may be predetermined for each fuse of interest or across a family of fuses.

In the second state the fuse resistance necessarily moves between two values, namely $R_1$ that corresponds to the equilibrium resistance just before the abrupt current change takes place, and $R_2$ that corresponds to the equilibrium resistance at the new current level. In between the two levels $R_1$ and $R_2$, the fuse resistance will follow the inverse exponential curve determined by the fuse time constant. The fuse time constant $\tau$ can be modeled as part of the thermal equilibrium characterization of the fuse, and based on such characterization the changing resistance may be determined as a function of time. The instantaneous voltage detected may be divided by this continuously changing resistance to find out the instantaneous value of current flowing through the fuse according to Ohm's law.

The third state or scenario corresponds to the state during which the fuse temperature again reaches thermal equilibrium. If the current doesn't encounter any high ramp rate event for a period of more than five time constants τ the third state can be assumed. This third state corresponds to the equilibrium state described above and serves as an error correction mechanism so that errors do not get piled up during a long term activity of fuse.

If the ramp rate of the detected voltage change is slower than a predetermined threshold then the fuse can be assumed to remain in thermal equilibrium and the current can be computed accordingly.

Figure 8B:
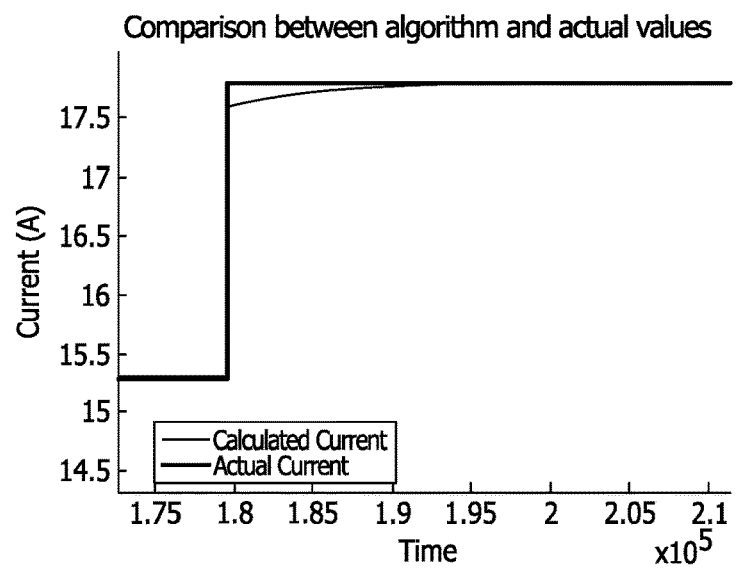
Figure 8A:
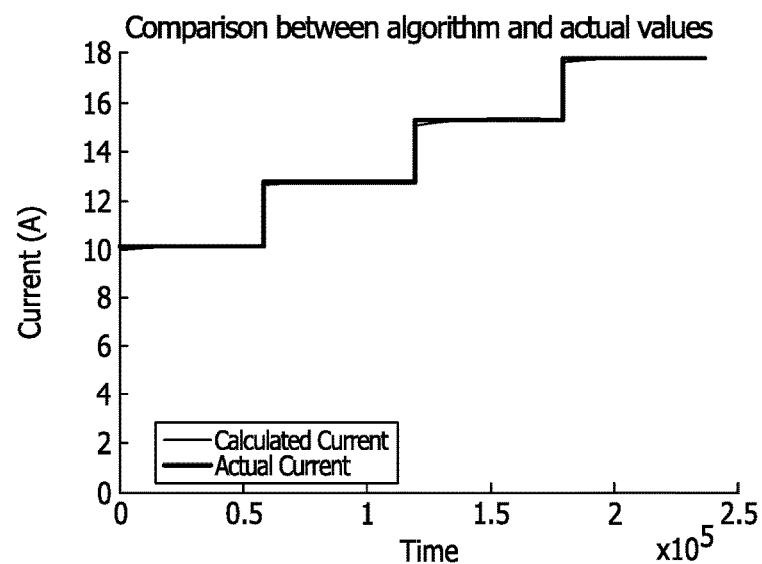

FIGS. 8A and 8B illustrate the performance of the three stage approach discussed above. For a series of step changes the calculated current per the three stage approach follows the actual current very closely. FIG. 8B is an enlarged plot of a portion of FIG. 8A. Less than a 1% error between calculated current and actual current is seen as the current reaches its new level, while over time the error becomes nearly zero as the new thermal equilibrium level is reached.

Figure 9:
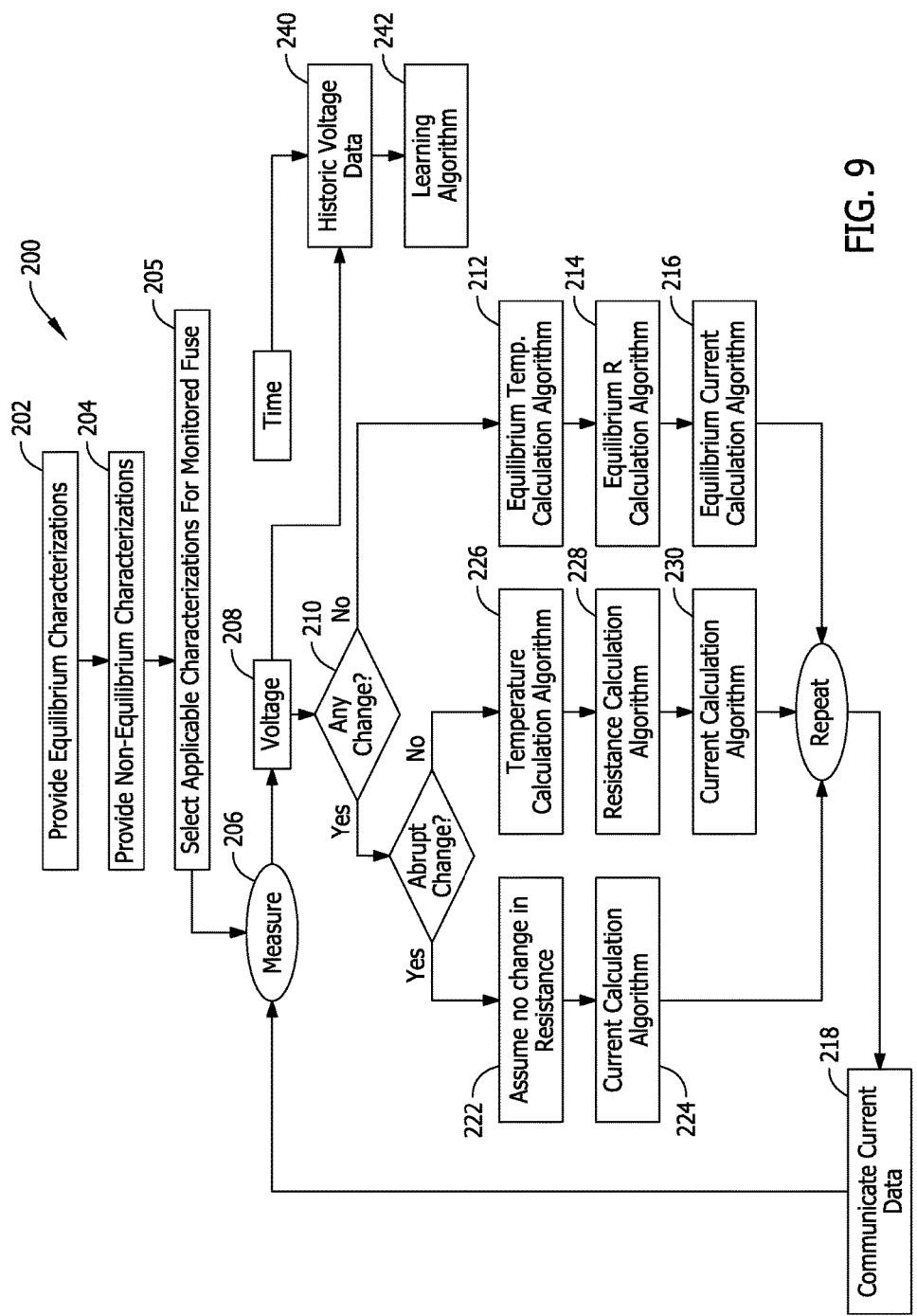
FIG. 9 is an exemplary method flowchart illustrating exemplary processes associated with the current sensing techniques and algorithms illustrated in relation to the preceding figures.

FIG. 9 is a method flowchart illustrating exemplary processes 200 associated with the current sensing techniques, systems, and circuitry described above.

As shown in FIG. 9, the method includes at step 202 providing a thermal equilibrium characterization of the fuse being monitored for current sensing. Exemplary relationships of current, resistance and temperature as a function of voltage that may correspond to the thermal equilibrium characterization are described above in relation to FIGS. 5A, 5B and 5C in a contemplated embodiment. The examples described herein are, however, merely examples that are provided for the sake of illustration rather than limitation. Other relationships for the thermal equilibrium characterization than those described can be used with circuitry other than that specifically described herein in further and/or alternative embodiments of the invention. The step of providing the thermal equilibrium characterization 202 may include associated steps of modeling, simulating, analyzing, empirically determining and/or testing to confirm the relationships to characterize the fuse at thermal equilibrium. Alternatively, the step of providing the thermal equilibrium characterization 202 may include obtaining the thermal equilibrium characterization from another party such as a fuse manufacturer and making the thermal equilibrium characterization available for use. The step of providing the thermal equilibrium characterization 202 may also include loading the data into memory of a processor-based device such as one of the controllers 112, 114 discussed above or otherwise allowing a processor device to access the thermal equilibrium characterization data for computing current as described. Access to the data may be provided via, for example, via a local area network, via an Internet connection, or via wireless communication systems allowing devices to exchange the necessary information with one another.

The method includes at step 204 providing a non-thermal equilibrium characterization of the fuse being monitored for current sensing. The non-thermal equilibrium characterization includes establishing a predetermined ramp rate threshold, the fuse time constant τ and a time-based resistant relationship discussed above. The step of providing the non-thermal equilibrium characterization 204 may include associated steps of modeling, simulating, analyzing, empirically determining and/or testing to confirm the relationships to characterize the fuse at non-thermal equilibrium. Alternatively, the step of providing the non-thermal equilibrium characterization 204 may include obtaining the non-thermal equilibrium characterization from another party such as a fuse manufacturer and making the thermal equilibrium characterization available for use. The step of providing the non-thermal equilibrium characterization 204 may also include loading the data into memory of a processor-based device such as one of the controllers 112, 114 discussed above or otherwise allowing a processor device to access the thermal equilibrium characterization data for computing current as described. Access to the data may be provided via, for example, via a local area network, via an Internet connection, or via wireless communication systems allowing devices to exchange the necessary information with one another.

The steps 202, 204 may be repeated for any number of different types of fuses, and a database may be created including uniquely identified thermal equilibrium characterization and non-thermal equilibrium characterization for each fuse that is to be monitored for current sensing purposes. A plurality of thermal equilibrium characterization relationships and non-thermal equilibrium characterization relationships are contemplated for specific use with respectively different types of fuses and different types of circuitry utilized to implement the measuring and calculation of the fuse element resistance. Accordingly, at step 205 the applicable characterizations may be selected for a specific fuse that is to be monitored with the current sensing system. The proper selection may be aided via, for example, a coded label on the fuse or another suitable identifier to match a specific fuse with its applicable characterizations so that the calculations may be made correctly. As described further below, the selection at step 205 may include reading a label with an electronic reader element to obtain identifying information for the fuse to facilitate matching the fuse with the proper characterizations so that the correct calculations can be made.

At step 206, the controller 112 or 114 or a voltage sensor element in communication with a controller is connected to a circuit including the fuse 102 as shown in FIG. 2. Once connected, the voltage across the fuse may be measured or detected at a predetermined time interval. The detected voltage at step 206 is output from the circuit and input to the controller 112 or 114 at step 208. At step 210, the voltage obtained at step 208 is monitored by the controller 112 or 114 for any change.

If the detected voltage is determined by the controller 112 or 114 to be unchanged at step 210, the fuse is assumed to be operating at thermal equilibrium. Using the thermal equilibrium characterization provided at step 202, the equilibrium temperature is calculated at step 210, the equilibrium resistance is calculated at step 214 and the equilibrium current is calculated at step 216. The calculations can be made by any of the processor-based devices described above and at various locations. As described above, each of these calculations is made in view of the characterized equilibrium temperature, equilibrium resistance, and equilibrium current as functions of voltage. Since the detected voltage is known and assumed to be the equilibrium voltage, the temperature, resistance and current values can be back-calculated from the characterized relationships. Once the values are calculated at steps 212, 214, 216 the process repeats in an iterative manner to again measure the voltage at step 206 at a predetermined time interval. Optionally, at step 218 the calculated temperature, resistance and current values are communicated to another device at the same or different location.

If at step 210 the detected voltage is determined to have changed by the controller 112 or 114, at step 220 the controller 112 or 114 determines whether the detected voltage is abrupt or not. This determination is made by comparing the rate of change in detected voltage to the predetermined ramp rate threshold as described above.

If the rate of change in detected voltage equals or exceeds the predetermined ramp rate threshold, the voltage range is considered abrupt at step 220. Once the abrupt voltage change determination is made, then at step 222 it is assumed that the resistance of the fuse is unchanged and the current calculation is made at step 224 using the last determined equilibrium resistance from step 216. Once the current calculation is made, the process repeats to again measure the voltage at step 206. Optionally, at step 218 the calculated temperature, resistance and current values are communicated to another device at the same or different location.

If the rate of change in detected voltage is less than the predetermined ramp rate threshold, it is not considered abrupt at step 220. Once this determination is made, the fuse is assumed to be operating in a non-thermal equilibrium state having a changing resistance. Using the non-thermal equilibrium characterization provided at step 204, the temperature is calculated at step 226 using the inverse exponential temperature relationship and the time constant $\tau$, the resistance is calculated at step 228 using the inverse exponential resistance relationship and the time constant $\tau$, and the current is calculated at step 230 using the calculated resistance. The calculations can be made by any of the processor-based devices described above and at various locations. Once the values are calculated at steps 226, 228, 230 the process repeats to again measure the voltage at step 206. Optionally, at step 218 the calculated temperature, resistance and current values are communicated to another device at the same or different location.

The controller 112 or 114 may therefore intelligently compute current values based on sensed voltage values made across the fuse in three different and distinct modes represented by the outcomes of the determinations represented at steps 210 and 220. It is recognized, however, that in some embodiments only one of the modes represented may suffice depending on the current conditions experienced in the power system. For example, and as noted above, the steps 212, 214 and 216 may provide satisfactory results for some power systems and accordingly may be the only calculation steps provided. Variations of the examples described are possible, however, as well as alternative embodiments that are extensions of the concepts disclosed herein.

As shown at step 240, the detected voltage data may also be saved in a data log 240 to create a history of detected voltage over time. This data could be used to re-calculate the applicable temperature, resistance and current values for study and analysis. This affords some intelligence to diagnostically assess the performance of the electrical power system and troubleshoot the system, as well as provide invaluable data to fuse manufacturers and other interested parties to assess the performance of the fuse in use. As indicated at step 242, such data may be helpful to prognostically indicate issues that have yet to be realized in the power system.

Having described the relationships, algorithms and computations functionally per the description above, those in the art may accordingly implement the relationships, algorithms and computations via programming of the controllers or other processor-based devices. Such programming or implementation of the concepts described is believed to be within the purview of those in the art and will not be described further.

Exemplary current sensing systems adopting the concepts and algorithms described above will now be described in more specific embodiments that are believed to be advantageous in fusible components and systems.

Figure 10:
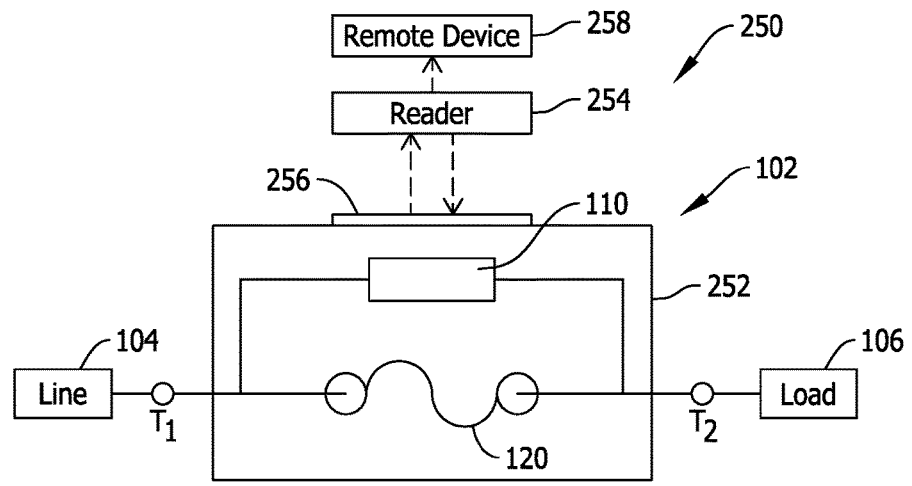
FIG. 10 schematically represents a first exemplary current sensing system according to an embodiment of the present invention.

FIG. 10 schematically represents a first exemplary current sensing system 250 according to an embodiment of the present invention. The system 250 includes the fuse 102 including the fuse element 120 and the circuitry 110 connected in parallel with the fuse element 120 inside a fuse housing 252. The fuse housing 252 is provided with fuse terminals $T_1$ and $T_2$ for establishing electrical connection with the line side circuitry 104 and the load side circuitry 106.

The fuse element 120 may be provided in any structural shape and configuration desired and may be designed to open in response to any overcurrent condition desired. The housing 252 may also be provided in any shape desired, including but not necessarily limited to round cylindrical shapes and rectangular shapes, and may be filled with an arc-extinguishing media. The fuse terminals $T_1$ and $T_2$ may be any known fuse terminal shape and configuration, including but not necessarily limited to end caps or ferrules, knife blade contacts, or terminal blades. In some contemplated embodiments the fuse 102 may be configured as a CUBE-Fuse® modular fuse of Bussmann by Eaton, St. Louis, Mo. having a rectangular housing and terminal blades projecting from a common side of the rectangular housing. Regardless, and as shown in FIG. 10, the compensation circuit 110 is embedded in the fuse construction. That is, the circuit 110 (including the controller 112 and perhaps other electronics such as those described above) are inside the fuse housing 252 and are accordingly built-in to the fuse 102.

A reader device 254 is shown as a separately provided device in the system 250. The reader device 254 may be a portable device in some embodiments or may be mounted stationary in other embodiments. In some embodiments the reader device 254 may be hand-held device. The reader device 254 may be a processor-based device and may communicate wirelessly with the circuitry 110 to receive the sensed voltage information or other data needed to analyze or calculate the current being sensed in the manner described above. While wireless communication between the circuitry 110 and the reader device 254 is beneficial in a large electrical power system 100, it is not in all cases strictly necessary and the reader device 254 may instead be hardwired to the circuitry 110 via connecting ports and terminals in the fuse 102 if desired.

The reader device 254 in a contemplated embodiment may be configured as an RFID reader or interrogator device. In such an embodiment, once the information is obtained from a corresponding RFID element in the circuit 110, the current of interest can be calculated by the reader device 254, or in an embodiment wherein the current is calculated within the electronics embedded in the fuse 102, the calculated current can simply be communicated to the reader device 254.

As previously mentioned, the fuse 102 may be provided with an RFID label or bar code label 256 on the housing 252 of the fuse 102. The label 256 may include encoded information to be communicated to a reader device 254. The reader device 254 may accordingly be a multi-functional device including multiple means of communicating with elements of the fuse. The RFID label or bar code label may include identifying information for the fuse 102, rating information for the fuse 102, and coded information facilitating the calculation of the sensed current. As such, by reading the label or bar code on the fuse housing, the reader device 254 can know which one of multiple predetermined equilibrium and non-equilibrium characterizations to use to calculate the current, and the reader device may also obtain any coefficients that may be unique the fuse 102 for use in the making the calculations. In such a scenario, the reader device 254 is an intelligent device that can distinguish different types of fuses and select one of a variety of predetermined characterizations to calculate the sensed current from the detected voltage.

Once obtained, the information obtained by the reader device 254, including the calculated current, can further be communicated to a remote device 258 via any desired communication network. The remote device 258 may facilitate monitoring and oversight of the electrical power system 100 and any related processes. The remote device 258 may, for example, be part of a Supervisory Control and Data Acquisition (SCADA) system monitoring aspects of an industrial facility and processes as those in the art may appreciate.

It is appreciated that in some embodiments the sensed current could actually be calculated by the remote device 258 at the remote location if desired, with the reader device 254 supplying only the information needed to make the calculation. Varying degrees of sophistication and complexity in the reader device 254 can be provided in the system 250 proposed at varying cost.

Figure 11:
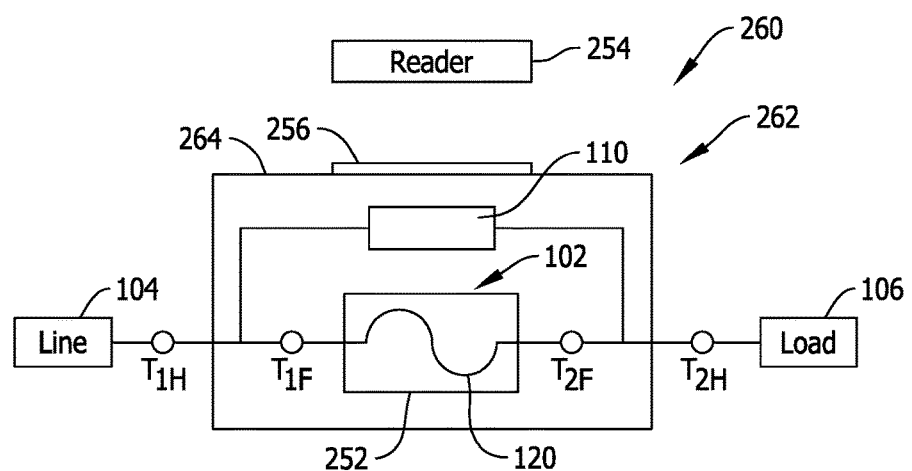
FIG. 11 schematically represents a second exemplary current sensing system according to an embodiment of the present invention.

FIG. 11 schematically represents a second exemplary current sensing system 260 according to another embodiment of the present invention. The system 260 includes a fuse holder or fuse block 262 including a housing 264 provided with terminals $T_{1H}$ and $T_{2H}$ respectively configured to structurally establish electrical connection to the line side and load side load side circuitry 104, 106. The terminals $T_{1F}$ and $T_{2F}$ of the fuse 102 are configured to structurally mate with the terminals $T_{1H}$ and $T_{2H}$ of the fuse holder or fuse block 262 such that an electrical connection between the line-side and load-side circuitry is established through the fuse element 120.

Unlike the system 250 (FIG. 10), in the system 260 the circuitry 110 is not provided in the housing 252 of the fuse, but is instead provided on or in the housing 264 of the fuse holder or fuse block 262. As such, the circuitry 110 in this embodiment is embedded in the fuse block 262 instead of in the fuse 102. The operation of the circuitry 110, however, remains the same, and the label 256 and reader 254 may also be provided as described above with similar effect.

In an alternative embodiment wherein the circuitry 110 is embedded in the fuse 102 as described above in the system 250, the reader 254 could be embedded in the fuse block or housing 262.

The fuse holder or fuse block housing 264 may be provided with multiple sets of terminals $T_{1H}$ and $T_{2H}$ such that multiple sets of fuses 102 can be accommodated in the fuse housing or fuse block 262. The housing 264 may be provided in a single piece or in multiple pieces, and may be provided in modular pieces that may be attached to one another. The housing 264 may be configured as an open-style fuse block or may partly or completely enclose the fuse(s) 102 as desired.

The terminals $T_{1H}$ and $T_{2H}$ provided on the housing 264 may include resilient spring clips that are structurally configured to receive and retain the terminals $T_{1F}$ and $T_{2F}$ of the fuse 102. The fuse terminals $T_{1F}$ and $T_{2F}$ may be provided in any shape and structural configuration, including but not necessarily limited to end caps or ferrules, knife blade contacts, or terminal blades. The terminals $T_{1H}$ and $T_{2H}$ on the fuse holder or fuse block housing 264 may accordingly be varied to mate with the terminals $T_{1F}$ and $T_{2F}$ of the fuse 102. Fuse rejection features may be built-in to the terminals $T_{1T}$ and $T_{2F}$ of the fuse 102 and/or may be incorporated into the housing 264 to prevent installation of an incompatible fuse.

The terminals $T_{1H}$ and $T_{2H}$ provided on the housing 264 also include terminal features such as box lugs, spring clamps, or other terminals configured to accept and retain an end of a wire utilized to establish the line side and load side electrical connections to the fuse block or housing 262. Alternatively, panel mount clips and the like, as well as another terminal structure to establish mechanical and electrical connection to the line and load side circuitry 104, 106 may be provided.

Figure 12:
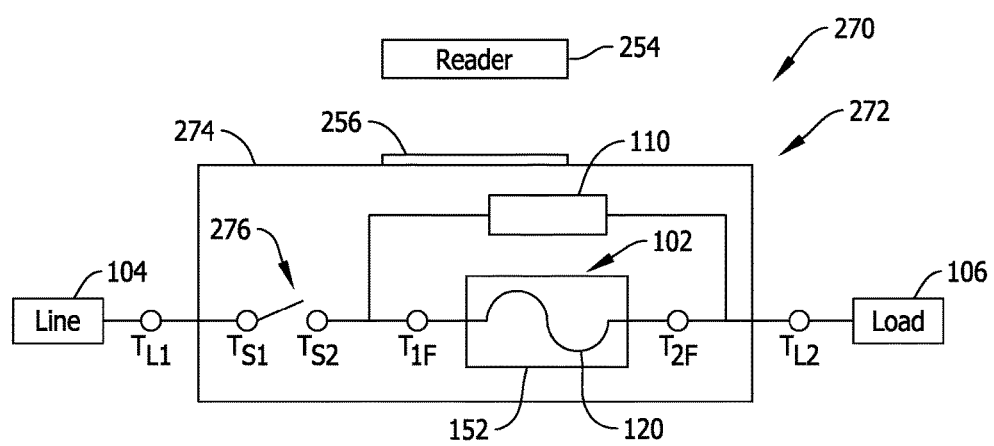
FIG. 12 schematically represents a third exemplary current sensing system according to an embodiment of the present invention.

FIG. 12 schematically represents a third exemplary current sensing system 270 according to an embodiment of the present invention. The system 270 includes a fusible disconnect switch device 272 including a housing or base 274 provided with terminals $T_{1L}$ and $T_{2L}$ respectively configured to structurally establish electrical connection to the line side and load side circuitry 104, 106. A switch 276 is provided in the housing or base 274 that may be selectively opened or closed to make or break the current path through the disconnect switch device 272, and when the fuse 102 is installed and the switch 276 is closed, the fuse element 120 of the fuse 102 completes an electrical connection between the line side and load side circuitry 104, 106. The base 274 may in some embodiments be configured as a Compact Circuit Protector (CCP) of Bussmann by Eaton, St. Louis, Mo. As can be seen in the schematic of FIG. 12, the disconnect switch device 272 does not include an in-line circuit breaker and is accordingly smaller than conventional in-line circuit breaker and fuse combinations.

The terminals $T_{1F}$ and $T_{2F}$ of the fuse 102 are configured to structurally mate with complementary terminals of the base 274 such that an electrical connection may be established through the fuse element 120. The complementary terminals of the base 274 may include resilient spring clips that are structurally configured to receive and retain the terminals $T_{1F}$ and $T_{2F}$ of the fuse 102. The fuse terminals $T_{1F}$ and $T_{2F}$ may be provided in any shape and structural configuration, including but not necessarily limited to end caps or ferrules, knife blade contacts, or terminal blades. The complementary terminals on the fuse holder or fuse block housing may accordingly be varied to mate with the terminals $T_{1F}$ and $T_{2F}$ of the fuse 102. Fuse rejection features may be built-in to the terminals $T_{1F}$ and $T_{2F}$ of the fuse 102 and/or may be incorporated into the housing 274 to prevent installation of an incompatible fuse. When the fuse 102 is installed, the switch 276 may be operated to connect or disconnect the electrical connection through the fuse element 120 and between the line side and load side circuitry 104, 106. As such, the switch 276 provides a connection and disconnection of the circuit path through the device 272 while the fuse 102 remains in place.

In the embodiment shown in FIG. 12, the circuitry 110 is not provided in the housing 152 of the fuse 102, but is instead provided on or in the base 274 of the switch disconnect device 272. As such, the circuitry 110 in this embodiment is embedded in the base 274 instead of in the fuse 102. The operation of the circuitry 110, however, remains the same, and the label 256 and reader 254 may also be provided as described above with similar effect.

In an alternative embodiment wherein the circuitry 110 is embedded in the fuse 102 as described above in the system 250, the reader 144 could be embedded in the base 274.

The base 274 may be provided with multiple sets of terminals such that multiple sets of fuses 102 can be accommodated. The base 274 may be provided in a single piece or in multiple pieces, and may be provided in modular pieces that may be attached to one another. The base 274 may partly or completely enclose the fuse(s) 102 as desired.

Terminals $T_{1L}$ and $T_{2L}$ provided on the base 274 also include terminal features such as box lugs, spring clamps, or other terminals configured to accept and retain an end of a wire utilized to establish the line side and load side electrical connections to the disconnect switch device 272. Alternatively, panel mount clips and the like, as well as another terminal structure to establish mechanical and electrical connection to the line side and load side circuitry 104, 106 may be provided.

In view of the systems 250, 260 and 270, the small size and simple architecture of the current sensing systems may be implemented flexibly to advantageously sense voltage across the fuse and calculate the current according the thermal equilibrium and non-thermal equilibrium characterizations in a cost effective manner. More expensive and bulkier current sensing solutions, including but not limited to resistive shunts as shown in FIG. 1, can be avoided in favor of a more compact and economical current sensing via the fuse as described.

The advantages and benefits of the invention are now believed to have been amply demonstrated in relation to the exemplary embodiments disclosed.

An embodiment of an electrical current sensing system has been disclosed including: a conductor having a non-linear resistance when connected to an electrical power system; and a processor receiving a voltage sensed across the conductor and operable to iteratively calculate a current flowing through the conductor based on at least a first detected state of the sensed voltage and a thermal equilibrium characterization of the conductor.

Optionally, the conductor may be a fuse element. The fuse element may be contained in a fuse housing, and the processor may also contained in the fuse housing. Alternatively, the system may include a fuse holder, and the processor may be provided on the fuse holder. As still another alternative, the system may include a disconnect switch, and the processor may be provided on the disconnect switch.

The system may further include a reader device configured to communicate with the processor. The system may include a label associated with the conductor, and the reader device may be configured to read the label and utilize information from the label to calculate the current flowing through the conductor.

The processor may further be operable to calculate a current flowing through the conductor based on at least a second detected state of the sensed voltage and a non-thermal equilibrium characterization of the conductor. The processor may be configured to compare a rate of change of the detected state of the sensed voltage and a predetermined ramp rate threshold. If the rate of change of the detected state of the sensed voltage is below the predetermined ramp rate threshold, the processor may be operable to calculate the current based on an inverse exponential relationship of resistance and time. If the rate of change of the detected state of the sensed voltage is above the predetermined ramp rate threshold, the processor may be operable to calculate the current based on a last prior calculated resistance of the conductor.

An embodiment of an electrical current sensing system has also been disclosed including: an electrical fuse including a housing, first and second terminal elements, and a fuse element having a non-linear resistance when connected to an electrical power system; and a processor receiving a voltage sensed across the fuse element, wherein the processor is operable to iteratively calculate a current flowing through the fuse element in a different manner depending on at least one of a first detected state and second detected state of the voltage sensed across the fuse element; wherein in the first detected state of the voltage sensed across the fuse element the current is calculated based on the voltage sensed across the fuse element and a thermal equilibrium characterization of the fuse element; and wherein in the second detected state of the voltage sensed across the fuse element the current is calculated based on the voltage sensed across the fuse element and a non-thermal equilibrium characterization of the fuse element.

Optionally, the processor may be contained in the fuse housing. The system may include a fuse holder, and the processor may alternatively be provided on the fuse holder. The system may alternatively include a disconnect switch, and the processor may be provided on the disconnect switch. The electrical fuse may include at least one of a bar code and an RFID tag, and the system may include a reader device configured to communicate with the at least one of the bar code and the RFID tag to obtain information to make the current calculation. A label may be associated with the electrical fuse, and the reader device may be configured to read the label and utilize information from the label to determine the applicable thermal equilibrium characterization and non-thermal equilibrium characterization.

A method of sensing current in an electrical power system has been disclosed. The method includes: providing a conductor having a non-linear resistance when connected to an electrical power system; sensing a voltage across the conductor; and calculating the current flowing through the conductor based on at least a first detected state of the sensed voltage and a thermal equilibrium characterization of the conductor.

The method may optionally include providing the conductor having a non-linear resistance when connected to an electrical power system comprises providing an electrical fuse including a fuse element. The fuse may include a fuse housing, and sensing a voltage across the conductor may include sensing the voltage across the fuse element at a location inside the fuse housing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical current sensing system comprising:
 a conductor having a non-linear resistance when connected to an electrical power system; and a processor receiving a voltage sensed across the conductor when connected to the electrical power system, the processor being operable to iteratively calculate a current flowing through the conductor based on at least a first detected state of the sensed voltage and a thermal equilibrium characterization of the conductor.

2. The electrical current sensing system of claim 1, wherein the conductor is a fuse element.

3. The electrical current sensing system of claim 2, wherein the fuse element is contained in a fuse housing, and the processor is also contained in the fuse housing.

4. The electrical current sensing system of claim 2, further comprising a fuse holder, and the processor provided on the fuse holder.

5. The electrical current sensing system of claim 2, further comprising a disconnect switch, and the processor provided on the disconnect switch.

6. The electrical current sensing system of claim 1, further comprising a reader device configured to communicate with the processor.

7. The electrical current sensing system of claim 6, further comprising a label associated with the conductor, the reader device configured to read the label and utilize information from the label to calculate the current flowing through the conductor.

8. The electrical current sensing system of claim 1, wherein the processor is further operable to calculate the current flowing through the conductor based on at least a second detected state of the sensed voltage and a non-thermal equilibrium characterization of the conductor.

9. The electrical current sensing system of claim 8, wherein the processor is configured to compare a rate of change of the detected state of the sensed voltage and a predetermined ramp rate threshold.

10. The electrical current sensing system of claim 9, wherein if the rate of change of the detected state of the sensed voltage is below the predetermined ramp rate threshold, the processor is operable to calculate the current flowing through the conductor based on an inverse exponential relationship of resistance and time.

11. The electrical current sensing system of claim 9, wherein if the rate of change of the detected state of the sensed voltage is above the predetermined ramp rate threshold, the processor is operable to calculate the current flowing through the conductor based on a last prior calculated resistance of the conductor.

12. An electrical current sensing system comprising:
an electrical fuse including a housing, first and second terminal elements, and a fuse element having a non-linear resistance when connected to an electrical power system; and
a processor receiving a voltage sensed across the fuse element when connected to the electrical power system, wherein the processor is operable to iteratively calculate a current flowing through the fuse element in a different manner depending on at least one of a first detected state and second detected state of the voltage sensed across the fuse element;
wherein in the first detected state of the voltage sensed across the fuse element the current is calculated based on the voltage sensed across the fuse element and a thermal equilibrium characterization of the fuse element; and
wherein in the second detected state of the voltage sensed across the fuse element the current is calculated based on the voltage sensed across the fuse element and a non-thermal equilibrium characterization of the fuse element.

13. The electrical current sensing system of claim 12, wherein the processor is contained in the fuse housing.

14. The electrical current sensing system of claim 12, further comprising a fuse holder, and the processor provided on the fuse holder.

15. The electrical current sensing system of claim 12, further comprising a disconnect switch, and the processor provided on the disconnect switch.

16. The electrical current sensing system of claim 12, the electrical fuse including at least one of a bar code and an RFID tag, the system further comprising a reader device configured to communicate with the at least one of the bar code and the RFID tag to obtain information to make the current calculation.

17. The electrical current sensing system of claim 16, further comprising a label associated with the electrical fuse, the reader device configured to read the label and utilize information from the label to determine the applicable thermal equilibrium characterization and non-thermal equilibrium characterization.

18. A method of sensing current in a conductor having a non-linear resistance in an electrical power system, the method implemented with a processor-based device, and the method comprising:
sensing a voltage across the conductor when connected to the electrical power system; and
iteratively calculating, by the processor-based device, the current flowing through the conductor based on at least a first detected state of the sensed voltage and a thermal equilibrium characterization of the conductor.

19. The method of claim 18, wherein sensing a voltage across the conductor when connected to the electrical power system comprises sensing a voltage across a fuse element in an electrical fuse.

20. The method of claim 19, wherein the electrical fuse includes a fuse housing, and wherein sensing a voltage across the fuse element comprises sensing the voltage at a location inside the fuse housing.

* * * * *